(12) United States Patent
Choi et al.

(10) Patent No.: US 11,348,810 B2
(45) Date of Patent: *May 31, 2022

(54) DRY ETCHING DEVICE AND METHOD FOR CONTROLLING SAME

(71) Applicant: VAULT CREATION CO., LTD., Seoul (KR)

(72) Inventors: Sang Jun Choi, Seoul (KR); Ji Sung Kang, Gimje-si (KR)

(73) Assignee: VAULT CREATION CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/343,591

(22) PCT Filed: Oct. 13, 2017

(86) PCT No.: PCT/KR2017/011294
§ 371 (c)(1),
(2) Date: Apr. 19, 2019

(87) PCT Pub. No.: WO2018/074780
PCT Pub. Date: Apr. 26, 2018

(65) Prior Publication Data
US 2019/0318942 A1 Oct. 17, 2019

(30) Foreign Application Priority Data
Oct. 21, 2016 (KR) .......................... 10-2016-0137827

(51) Int. Cl.
*H01L 21/67* (2006.01)
*H01J 37/32* (2006.01)
(Continued)

(52) U.S. Cl.
CPC .. *H01L 21/67069* (2013.01); *H01J 37/32128* (2013.01); *H01J 37/32568* (2013.01);
(Continued)

(58) Field of Classification Search
CPC ........... H01L 21/67069; H01L 21/0273; H01L 21/3065; H01L 21/3081; H01L 21/3086;
(Continued)

(56) References Cited

U.S. PATENT DOCUMENTS

| 4,798,650 A | * | 1/1989 | Nakamura | ........ H01L 21/32136 |
| | | | | 438/673 |
| 6,245,189 B1 | * | 6/2001 | Rigali | ............... H01J 37/32082 |
| | | | | 118/723 E |

(Continued)

FOREIGN PATENT DOCUMENTS

| JP | 8-134666 | 5/1996 |
| JP | 2005-268436 | 9/2005 |

(Continued)

OTHER PUBLICATIONS

International Search Report for International Application No. PCT/KR2017/011294, dated Jan. 22, 2018.

(Continued)

*Primary Examiner* — Ram N Kackar
*Assistant Examiner* — Laureen Chan
(74) *Attorney, Agent, or Firm* — Kile Park Reed & Houtteman PLLC

(57) ABSTRACT

A dry etching device which can be used to etch products or used in processes regardless of materials and exhibits an excellent accuracy, and a method for controlling the same. The dry etching device includes: an anode part; a cathode part disposed at an upper side of the anode part and facing the anode part, receiving bi-directional voltage power in which polarity of a voltage alternates between a positive voltage and a negative voltage depending on time, and spaced apart from the anode part; a leveling part disposed in close contact with a surface of the cathode part facing the anode part, and for positioning a work-piece in a flat state;

(Continued)

a holding part for holding the work-piece and the leveling part to the surface of the cathode part facing the anode part; and a bi-directional voltage power supplier for applying the bi-directional voltage power to the cathode part.

9 Claims, 6 Drawing Sheets

(51) Int. Cl.
*H01L 21/027* (2006.01)
*H01L 21/3065* (2006.01)
*H01L 21/308* (2006.01)
*H01L 21/3213* (2006.01)
*H01L 21/683* (2006.01)
*H01L 21/321* (2006.01)

(52) U.S. Cl.
CPC .... *H01J 37/32715* (2013.01); *H01L 21/0273* (2013.01); *H01L 21/3065* (2013.01); *H01L 21/3081* (2013.01); *H01L 21/3086* (2013.01); *H01L 21/32136* (2013.01); *H01L 21/32139* (2013.01); *H01L 21/6831* (2013.01); *H01J 2237/002* (2013.01); *H01J 2237/24585* (2013.01); *H01J 2237/3341* (2013.01); *H01L 21/3212* (2013.01); *H01L 21/67248* (2013.01)

(58) Field of Classification Search
CPC ......... H01L 21/32136; H01L 21/32139; H01L 21/6831; H01L 21/3212; H01L 21/67248; H01L 21/6835; H01L 21/31116; H01L 21/673; H01L 21/6836; H01J 37/32128; H01J 37/32568; H01J 37/32715; H01J 37/32091; H01J 37/32137; H01J 37/32697; H01J 37/32706; C23C 16/04; C23C 16/042; C23C 16/047
See application file for complete search history.

(56) References Cited

U.S. PATENT DOCUMENTS

| | | | |
|---|---|---|---|
| 2006/0037703 A1* | 2/2006 | Koshiishi | H01J 37/3244 156/345.47 |
| 2007/0017630 A1* | 1/2007 | Kirby | H01L 21/6835 156/250 |
| 2011/0024399 A1* | 2/2011 | Kim | H01J 37/32009 219/121.41 |
| 2011/0303643 A1* | 12/2011 | Wada | H01J 37/32091 216/71 |
| 2013/0136872 A1* | 5/2013 | Booth | H01J 37/32091 427/569 |
| 2015/0332944 A1* | 11/2015 | Landesberger | H01L 21/6831 156/60 |

FOREIGN PATENT DOCUMENTS

| | | |
|---|---|---|
| KR | 10-2009-0106730 | 10/2009 |
| KR | 10-2014-0068090 | 6/2014 |
| KR | 10-2014-0113530 | 9/2014 |

OTHER PUBLICATIONS

Written Opinion for International Application No. PCT/KR2017/011294 with English translation, dated Jan. 22, 2018.

* cited by examiner

DRY ETCHING DEVICE AND METHOD FOR CONTROLLING SAME

TECHNICAL FIELD

The present invention relates generally to a dry etching device and, more particularly, to a dry etching device which is capable of being used to etch products or used in processes regardless of materials and realizes excellent precision and to a method for controlling the dry etching device.

BACKGROUND ART

An etching process has been applied during a processing process of semiconductors, various materials, or products.

The etching process is a process of etching a part of a surface of a work-piece, and a wet etching method using a chemical process is generally used.

However, use of the etching method has expanded to various new materials, such that the wet etching method has reached a limit in application.

Recently, a dry etching method instead of the wet etching method has been introduced.

FIG. 1 shows a process in which copper (Cu) of the semiconductor is etched by using the dry etching method.

In the example, the work-piece in which a hard mask 20 is deposited on a silicon layer 10 is subjected to a lithography process, and then the dry etching is performed on the hard mask 20.

A photo-resist (PR) film 30 formed during the lithography process is removed, and then a copper (Cu) film 42 is deposited in a vacuum chamber.

Cu 44 is deposited on an upper side of the deposited Cu film 42 in an electro-plating method, and then Cu 44 above the hard mask 20 is removed by using a chemical-mechanical polishing (CMP) method.

However, the conventional dry etching method includes the chemical process so that the process is subjected to various steps, and only a small number of volatile substances are applicable to the conventional dry etching method so that it is difficult to use various materials in the dry etching method.

In addition, the conventional dry etching method includes the chemical process, so that it has a limit in precision due to the chemical process, and there is a limit in reducing the processing time.

DISCLOSURE

Technical Problem

Accordingly, the present invention has been made keeping in mind the above problems occurring in the related art, and an objective of the present invention is to provide a dry etching device, which is not influenced depending on a chemical process, is applicable to various materials, and realizes excellent precision and reduced process speed, and to provide a method for controlling the dry etching device.

However, the objectives of the present invention are not limited to the objectives mentioned above, and other objectives not mentioned may be clearly understood by those skilled in the art from the description hereinafter.

Technical Solution

In order to accomplish the above objectives, the present invention provides a dry etching device, which includes: an anode part; a cathode part disposed at an upper side of the anode part and facing the anode part, receiving bi-directional voltage power of which polarity of a voltage alternates between a positive voltage and a negative voltage depending on time, and disposed to be spaced from the anode part; a leveling part disposed in close contact with a surface of the cathode part facing the anode part, and positioning a work-piece in a flat state; a holding part for holding the work-piece and the leveling part on the surface of the cathode part facing the anode part; and a bi-directional voltage power supplier for applying the bi-directional voltage power to the cathode part.

The leveling part is in close contact with the surface of the cathode part facing the anode part, and may include a flat plate configured such that the work-piece is closely attached to a rear surface thereof in the flat state.

The leveling part may further include a photo-resist film provided around a surface of the work-piece and on the flat plate to which the work-piece is attached.

The leveling part may be provided with an adhesive layer at a position between the flat plate and the work-piece for attaching the work-piece to the flat plate.

The adhesive layer may be made of an adhesive material.

The work-piece may be attached to the flat plate by using static electricity.

The dry etching device may further include: an insert layer laminated between the work-piece and the photo-resist film and made of a material that is the same as a semiconductor or a nonconductor.

The holding part may support elastically the leveling part so that the flat plate provided with the work-piece and the photo-resist film is disposed in close contact with the surface of the cathode part facing the anode part.

The dry etching device may further include: a direct current (DC) voltage power applier for applying DC voltage power to the anode part so that ion hitting time applied to the work-piece is reduced and electron hitting time applied thereto is increased.

The power applied through the DC voltage power applier may be a positive voltage or a negative voltage.

According to another embodiment of the present invention, the present invention provides a method for controlling the dry etching device, which includes: attaching a work-piece to a flat plate; laminating a photo-resist film on the work-piece attached to the flat plate and on the flat plate; exposing the laminated photo-resist film to provide a pattern, after the laminating; positioning the photo-resist film exposed in the exposing, the work-piece, and the flat plate on a surface of a cathode part facing an anode part to be in close contact therewith; applying bi-directional voltage power to the cathode part, in which the power is applied such that polarity of a voltage alternates between a positive voltage and a negative voltage depending on time; and etching a surface of the work-piece by plasma generated by the bi-directional voltage power applied to the cathode part.

The method may further include: applying direct current voltage power to the anode part, after or at the same time as applying the bi-directional voltage power.

Advantageous Effects

According to a dry etching device and a method for controlling the dry etching device of the present invention, time required for an etching process is remarkably reduced compared with the conventional method so that productivity is improved, the method is not influenced depending on materials so that dry etching can be applied to various materials, re-deposition of materials does not occur so that the etched portion can be formed clearly without contamination due to re-deposition materials, and precision can be improved.

The effects of the present invention are not limited to the effects mentioned above, and other effects not mentioned may be clearly understood by those skilled in the art from the accompanying claims.

DESCRIPTION OF DRAWINGS

The above and other objects, features and other advantages of the present invention will be more clearly understood from the following; detailed description when taken in conjunction with the accompanying drawings. The exemplary embodiments are shown in the accompanying drawings for purposes of illustrating the present invention. However, it should be understood that the application is not limited to the precise arrangement and means shown in the accompanying drawings, in which.

BEST MODE

Figure 1:
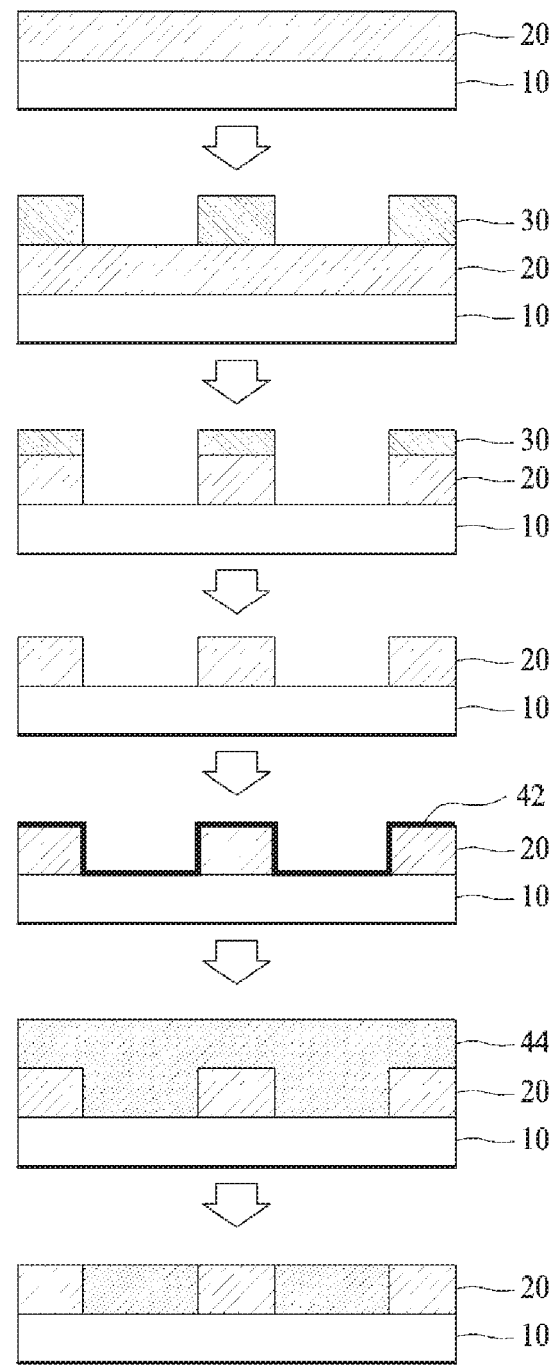
FIG. 1 is a view showing a process in which a copper layer is formed on a semiconductor by using a dry etching method of the related art.

Hereinbelow, exemplary embodiments of the present invention will be described in detail with reference to the accompanying drawings. Further, when describing the components of the present invention, the same reference numerals will be used throughout the drawings and the description to refer to the same or like elements or parts, thus a detailed description of those elements will be omitted.

In order to be free from a limitation by materials in comparison with the dry etching method of the related art described in the background art, the applicant has actively studied on that high-energy ion source should be hit a work-piece more strongly, process temperature differs for each work-piece, and process temperature deviation should be maintained small during processing the work-piece when the process temperature is set. For example, when temperature of the work-piece is higher than 80 degrees, a photoresist PR may be prevented from hardening. In addition, during the processing of the work-piece, various process temperature profiles setting control may be possible, such as suppression of deviation of etching yield rate due to the process temperature deviation and upper and lower temperature setting of some work-piece materials.

The applicant focuses on expansion of a sheath region of plasma, use of high voltage and bi-directional voltage power equal to or less than 1 MHz, and plasma density enhancement, so that the high-energy ion source hits a work-piece with higher kinetic energy.

In addition, for performing given temperature control of the work-piece, the applicant focuses on isolation to prevent current from being applied to the work-piece and addition of temperature control function to a cathode part in which the work-piece is positioned. Here, an insulator contacting the work-piece is attached to a portion where the bi-directional voltage power is applied, by using an integral coating technique or an adhesive technique using a bonding material with excellent heat transfer, and thus the insulator can rapidly dissipate generated heat, thereby facilitating the temperature control.

Figure 2:
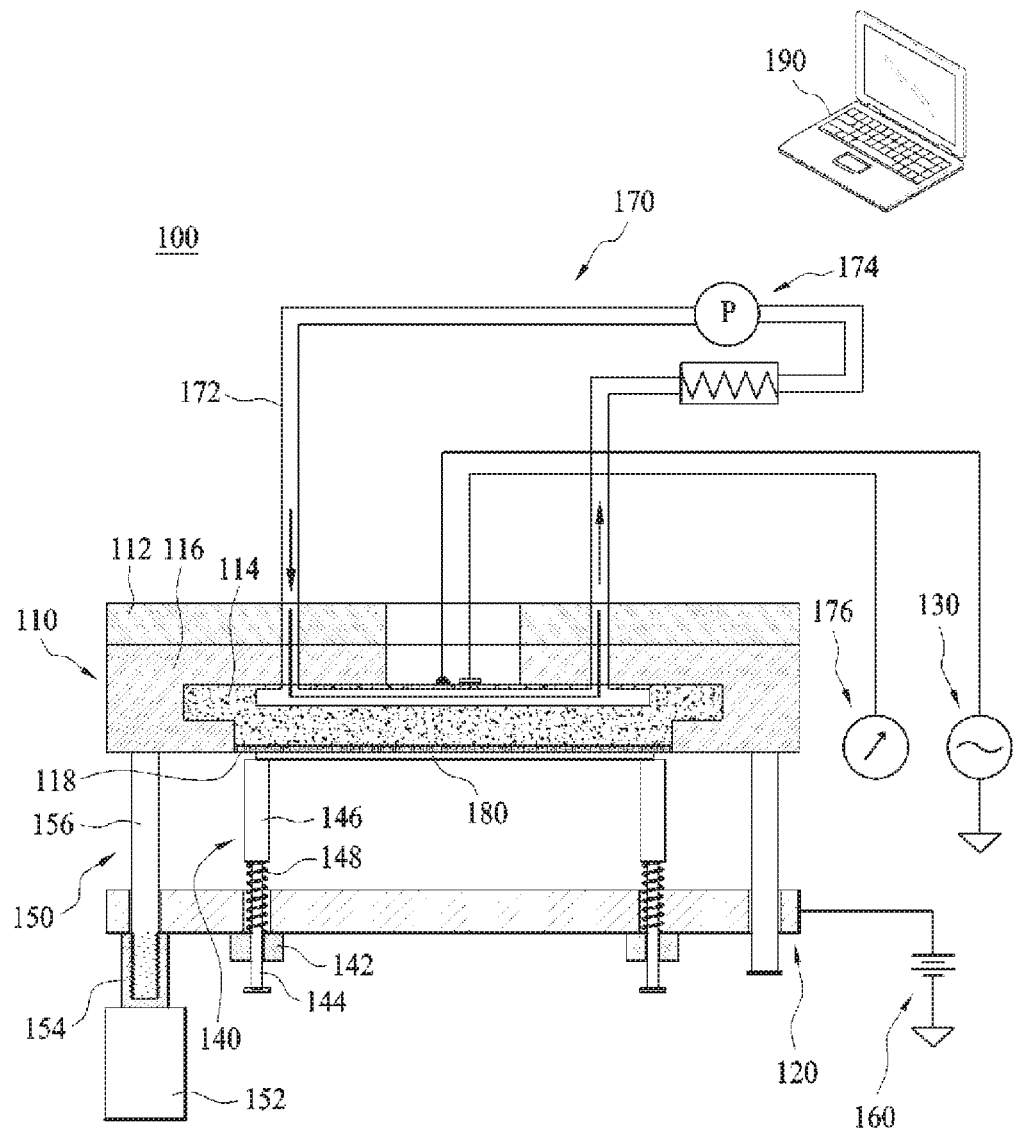
FIG. 2 is a cross-sectional view showing a dry etching device according to an embodiment of the present invention.

According to an embodiment having this direction, a dry etching device 100 may include an anode part 120, a cathode part 110, a holding part 140, a bi-directional voltage power supplier 130, and a leveling part 180 as shown in FIG. 2.

The anode part 120 and the cathode part 110 are disposed inside a housing (not shown) and disposed to be spaced apart from each other in a vertical direction.

The housing (not shown) provides a space therein in which various components described later herein are disposed, may be configured such that a vacuum space is provided therein or a gas such as argon (Ar) is injected into the housing, and may be opened and closed so that the leveling part 180 is inserted in and removed from the housing.

Here, the cathode part 110 may be disposed at an upper side of the housing, and the anode part 120 may be disposed at a lower side thereof.

The bi-directional voltage power supplier 130 may apply bi-directional voltage power to the cathode part 110.

Here, the bi-directional voltage power may refer to a current in which polarity of voltage alternates in both directions with a positive voltage and a negative voltage depending on time.

In addition, a frequency of the bi-directional voltage power may be equal to or less than 1 MHz.

As described above, charge accumulation time may be increased by applying the bi-directional voltage power, which may contribute to the expansion of the sheath region of plasma. By securing time at which ions accelerate to a work-piece side due to the expansion of the sheath region of plasma, the ions may hit a surface of the work-piece W provided on the leveling part 180 with higher energy. The bi-directional voltage power will be described in detail later.

The leveling part 180 may be disposed in close contact with a lower side surface of the cathode part 110 facing the anode part 120.

Therefore, etching is performed at the lower side surface of the leveling part 180, and thus atoms removed from an etched surface of the work-piece W fall to an anode part side by gravity, so that the atoms are prevented from being redeposited on the lower side surface of the leveling part 180.

Meanwhile, the leveling part 180 is a component for positioning the work-piece W in close contact with the cathode part 110 in a flat state.

In the dry etching device 100 of the embodiment, the work-piece W may be attached to the lower side surface of the cathode part 110. However, when the work-piece W is a very thin sheet, the center part of the work-piece W may not be in close contact with the lower side surface of the cathode part 110 and be spaced apart to have a space between the work-piece W and the cathode part 110. The space provided between the work-piece W and the cathode part 110 causes failures in the processing.

Accordingly, the leveling part 180 is the component for positioning the work-piece W levelly on the cathode part 110. That is, the work-piece W is levelly attached to the lower side surface of the leveling part 180 without creasing, and the leveling part 180 to which the work-piece W is attached is located in close contact with the lower side surface of the cathode part facing the anode part 120.

Figure 3:
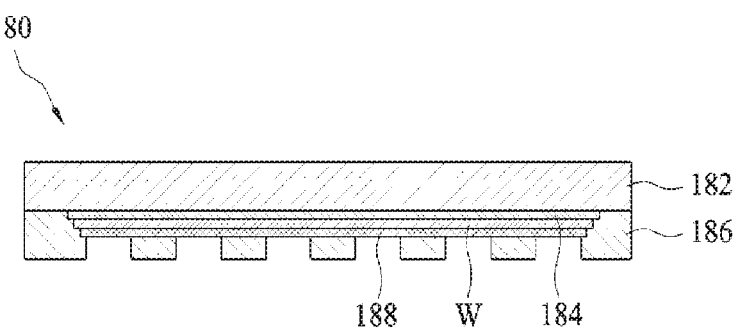
FIG. 3 is a view showing a leveling part of FIG. 2.

The leveling part 180 may include a flat plate 182 and a photo-resist film 186, as shown in FIG. 3.

As described above, the flat plate 182 may be configured such that the work-piece W is attached thereto, and may be formed of a plate that is a flat metal or semiconductor or nonconductor thereby being in close contact with the lower side surface of the cathode part 110.

In addition, the work-piece W may be attached to a surface of the flat plate 182. When the flat plate 182 is attached to the lower side surface of the cathode part 110, the surface of the flat plate 182 to which the work-piece W is attached is provided as a lower side surface facing the anode part 120. Therefore, in order to prevent the work-piece W from falling by gravity and weight, or from being dropped downward to be spaced apart from the flat plate 182, an adhesive layer 184 may be provided between the work-piece W and the flat plate 182.

The adhesive layer 184 may be a double-sided adhesive tape or a layer formed of an adhesive spread. In addition, attachment may also be performed by using static electricity without using an adhesive film or the adhesive.

The photo-resist film 186 is laminated to an outside of the flat plate 182 with the work-piece W attached thereto.

In addition, the laminated photo-resist film 186 is exposed to form a pattern.

Therefore, the work-piece W is attached in close contact with the flat plate 182 by the adhesive layer 184, and may be further attached in close contact therewith by the photo-resist film 186.

In addition, when necessary, an insert layer 188 having thickness of tens to hundreds of microns may be laminated between the photo-resist film 186 and the work-piece W. The insert layer 188 is formed into a constant thickness by using a semiconductor material or a nonconductor material.

The holding part 140 is a component for positioning the leveling part 180 to be in close contact with the lower side surface of the cathode part 110.

In addition, the dry etching device may further include a space adjusting part 150 for adjusting a distance between the cathode part 110 and the anode part 120.

Generally, the charge quantity Q is known to be proportional to an applied voltage V, a dielectric constant c, and an area A of the work-piece, and inversely proportional to the distance d between the cathode part and the anode part ($Q=V\varepsilon A/d$).

Accordingly, by adjusting the distance between the cathode part 110 and the anode part 120 by using the space adjusting part 150, etching of various work-pieces W having various areas A may be performed at a constant or optimal charge amount.

The space adjusting part 150 may include a motor 152, a coupling 154, and a tie bar 156. The tie bar 156 is formed of an isolating material to minimize effect on the plasma between the cathode part 110 and the anode part 120.

The motor 152 is a component for generating torque. In the embodiment, an example in which a step motor capable of finely adjusting rotation angle is applied to the dry etching device will be described. In addition, the step motor may be controlled by a control part 190 provided separately.

The coupling 154 is rotated ley the torque of the motor 152, is provided with a through hole that is coaxial with a rotational shaft along the rotational shaft, and is provided with a screw thread on an inner circumferential surface of the through hole. Here, the rotational shaft of the coupling 154 may be provided in the vertical direction.

The tie bar 156 is extended in the vertical direction, and is provided with a screw thread engaged with the inner circumferential surface of the coupling 154 on an outer circumferential surface thereof. Therefore, the tie bar 156 is inserted into the through hole to be engaged with the inner circumferential surface of the through hole of the coupling 154, and an upper end thereof supports the cathode part 110.

Accordingly, when the motor 152 is rotated, the coupling 154 is rotated together, and the tie bar 156 is elevated by the rotation angle of the motor 152 and a pitch of the coupling 154, so that the cathode part 110 supported at the upper end of the tie bar 156 is also elevated, thereby adjusting the distance between the cathode part 110 and the anode part 120.

Even when the cathode part 110 is elevated, the holding part 140 may support elastically the leveling part 180, so that the leveling part 180 is in close contact with the lower side surface of the cathode part 110.

The holding part 140 as described above may include a first member 144, a second member 146, and the spring 148.

The first member 144 is inserted into a locking piece 142 provided at a lower side of the anode part 120 so as to be moveable in the vertical direction, and is provided extended upward.

Here, the locking piece 142 may be fixed to the housing.

The second member 146 is provided on an upper end of the first member 144 with a diameter provided larger than a diameter of the first member 144. In addition, an upper end of the second member 146 supports the leveling part 180 so that the leveling part 180 is in close contact with the cathode part 110. The second member 146 may be formed of the isolating material so as to minimize effect on the plasma between the cathode part 110 and the anode part 120. The second member 146 may have various shapes such as a circular, a rectangular, a polygonal, and a cone shape corresponding to a shape of the leveling part 180.

The spring 148 is provided to cover an outside of the first member 144, and is configured such that a lower end thereof is supported by the locking piece 142 and an upper end thereof is supported by the second member 146, thereby supporting elastically the second member 146 regarding the locking piece 142

Accordingly, since the leveling part 180 supported by the spring 148 at the second member 146 is always supported elastically upward, even if the cathode part 110 is elevated, the leveling part 180 may be in close contact with the cathode part 110. Here, the spring 148 may be formed of the isolating material so as to minimize effect on the plasma between the cathode part 110 and the anode part 120.

Figure 4:
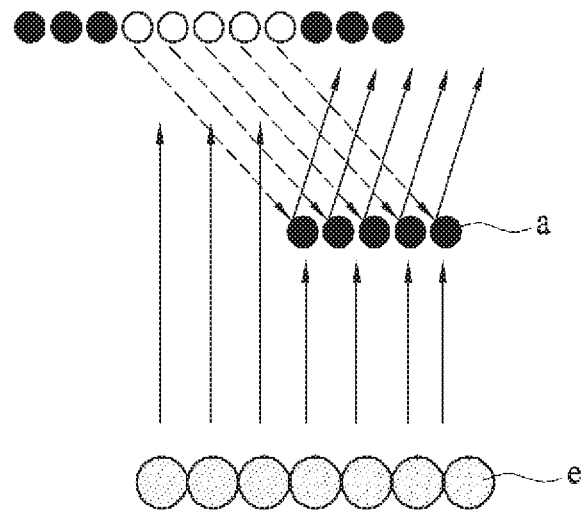
FIG. 4 is a view showing atoms removed by etching during a plasma etching process and which rebound by plasma ions or gas and then are redeposited.

Meanwhile, as shown in FIG. 4, re-deposition of materials may be generated as follows, some of atoms a, which are separated away from the etched surface of the work-piece W and fall to the anode part side, are hit with the ions i or plasma gas directed to the surface of the work-piece W, return to the surface side of the work-piece W again, and are redeposited on the surface of the work-piece W.

To prevent this, the dry etching device according to the embodiment may further include a direct current (DC) voltage power applier 160 for applying DC voltage power of a negative side or a positive side to the anode part 120, so that the ion hitting time applied to the work-piece is reduced and electron hitting time applied thereto is increased. In the embodiment, an example in which the DC voltage power applier 160 applies DC voltage power in the negative side will be described.

Before describing operation by the DC voltage power applier 160, a voltage waveform applied to the cathode part 110 by the bi-directional voltage power supplier 130 will be described.

Figure 5:
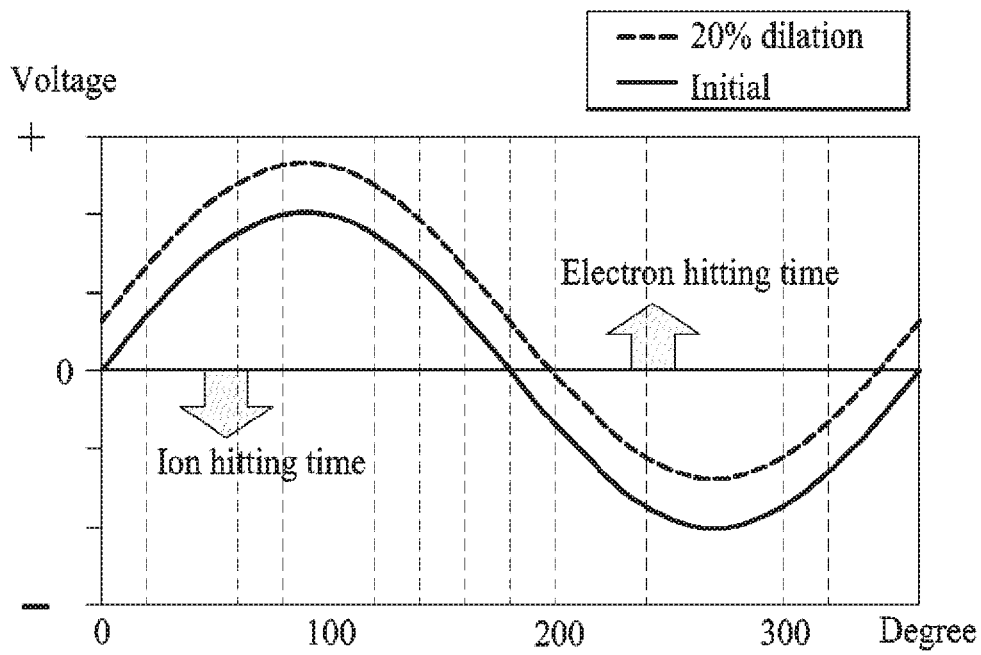
FIG. 5 is a graph showing a waveform of bi-directional voltage power in an alternating current (AC) form, and a waveform alternation of the bi-directional voltage power generated between a cathode and an anode when direct current (DC) power is applied to an anode part.

As described above, the voltage waveform applied to the cathode part 110 may be defined by a voltage in which the polarity of the voltage alternates between the positive voltage and the negative voltage. A waveform of bi-directional voltage generated by the bi-directional voltage power supplier 130 may have a sign waveform in a general alternating current (AC) form as shown in FIG. 5, or may have a bipolar waveform in a trapezoidal shape as shown in FIGS. 6 and 7.

That is, in the present invention, the bi-directional voltage power may be provided such that the polarity of the voltage alternates between the positive voltage and the negative voltage (with reference to a voltage of zero) depending on time, regardless of a shape and a size of the waveform.

Figure 6:
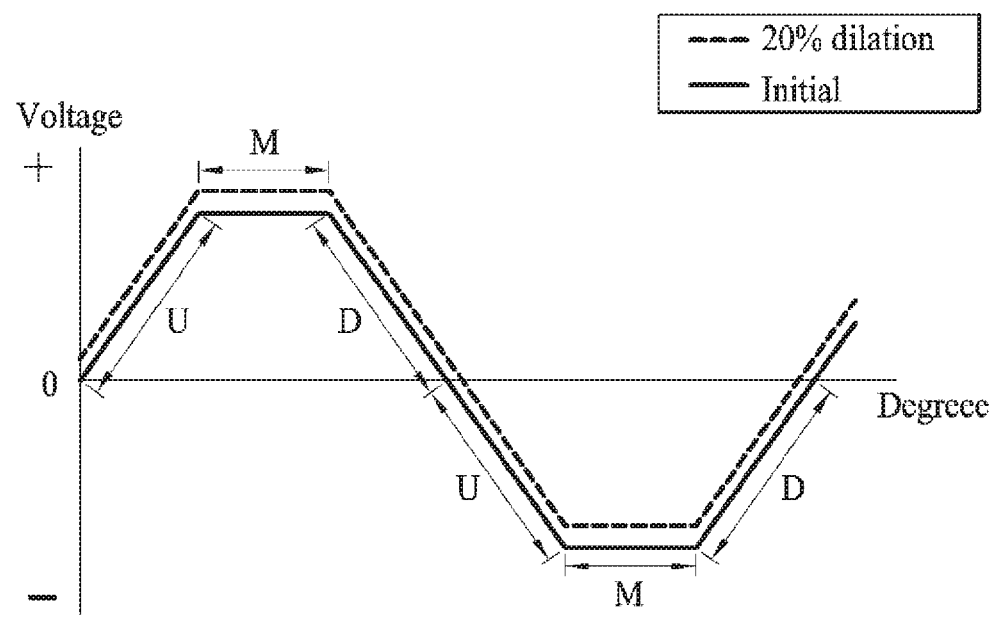
FIG. 6 is a graph showing a symmetric bipolar type waveform of bi-directional voltage power, and the waveform alternation of the bi-directional voltage power generated between the cathode and the anode when DC power is applied to the anode part.
Figure 7:
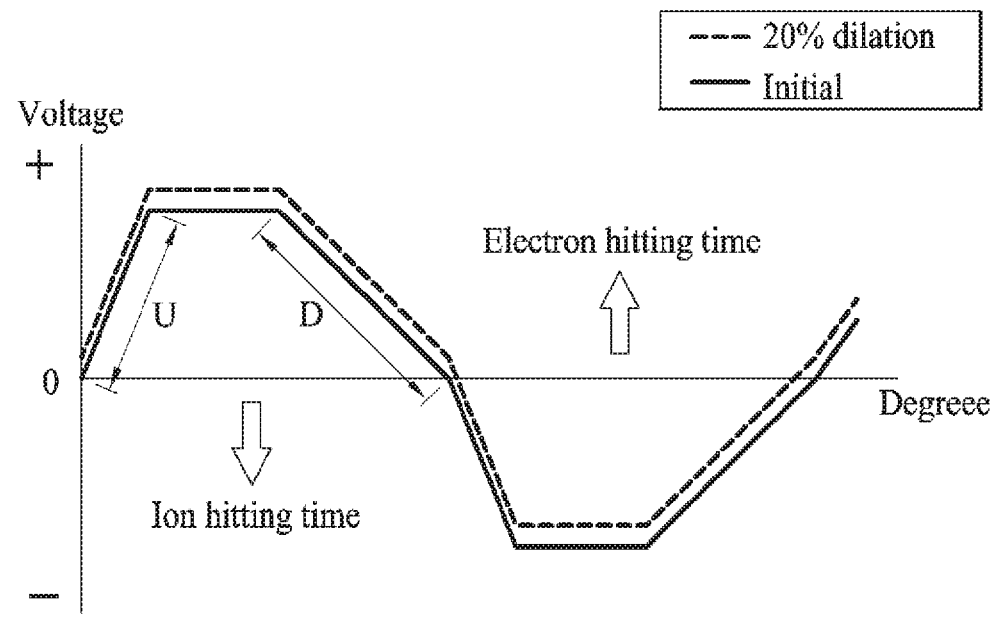
FIG. 7 is a graph showing an asymmetric bipolar type waveform of bi-directional voltage power, and the waveform alternation of the bi-directional voltage power generated between the cathode and the anode when DC power is applied to the anode part.

Meanwhile, when the shape of the bi-directional voltage has the bipolar waveform in the trapezoidal shape as shown in FIGS. 6 and 7, the voltage waveform may include a boost section U and a decreasing section D.

Here, a section of the voltage waveform that diverges to the positive side or the negative side will be referred to as the boost section U, and a section that converges to the zero will be referred to the decreasing section D.

In addition, a section in which the voltage is maintained constantly between the boost section U and the decreasing section D will be referred to a maintain section M.

Depending on the waveform of the bi-directional voltage power supplied from the bi-directional voltage power supplier 130, the maintain section M may or may not be provided.

In addition, the waveform of the bi-directional voltage power supplied from the bi-directional voltage power supplier 130 may be controlled by the control part 190.

The control part 190 may be realized by a terminal or a personal computer connected to the bi-directional voltage power supplier 130. However, the present invention is not limited thereto, and the control part 190 may be a module provided with an input means, a display means, a calculation means, and a communication means.

Meanwhile, when the waveform of the bi-directional voltage has the bipolar waveform in the trapezoidal shape as shown in FIGS. 6 and 7, gradients and lengths of the boost section U, the decreasing section D, and the maintain section M may be controlled by the control part 190.

That is, gradients of the boost section U and the decreasing section D may be symmetrical as shown in FIG. 6, or may be asymmetrical as shown in FIG. 7. Otherwise, although not shown in the drawings, a length of the maintain section D may be adjusted, and the maintain section D may be adjusted to be provided in a zero voltage state in addition to at a peak point.

That is, depending on times and intensities of electron hitting and of ion hitting which are required for the work-piece W, the maintain section D may be adjusted by the control part 190.

Hereinafter, operation of the DC voltage power applier 160 will be described.

FIG. 5 is a graph showing the sign waveform in which the bi-directional voltage power generated by the bi-directional voltage power supplier 130 has a waveform in an AC form, and showing a waveform alternation of the bi-directional voltage power generated between the cathode part 110 and the anode part 120 when the DC is applied to the anode part 120.

As described above, since a waveform of a bi-directional current in the AC form generated by the bi-directional voltage power supplier 130 is applied to the cathode part 110, the waveform of the bi-directional current provided between the cathode part 110 and the anode part 120 has a waveform in an AC form.

However, as shown in FIG. 5, when a negative side of the AC is applied to the anode part 120 by the DC voltage power applier 160, the waveform of the bi-directional voltage power in the AC form that is provided between the cathode part 110 and the anode part 120 moves upward. In the graph of FIG. 5, when the AC type waveform descends to a lower side (a negative side) of a zero voltage, the ions may hit the work-piece W, and when the AC type waveform ascends to an upper side (a positive side) of the zero voltage 0 Voltage, electrons may hit the work-piece W.

Otherwise, as shown in FIGS. 6 and 7, even if the waveform of the bi-directional voltage power generated by the bi-directional voltage power supplier 130 has the bipolar waveform in the trapezoidal form, when the negative side of the AC is applied to the anode part 120 by the DC voltage power applier 160, the waveform of the bi-directional voltage power in the bipolar form provided between the cathode part 110 and the anode part 120 may move upward. In FIGS. 6 and 7, when the waveform of the bi-directional voltage power in the bipolar form is in a state of descending to the lower side of the zero voltage, the ions may hit the work-piece W, and when the waveform of the bi-directional voltage power in the bipolar form is in a state of ascending to the upper side of the zero voltage, the electrons may hit the work-piece W.

In FIGS. 5 to 7, an example in which the bi-directional voltage power is shifted by 20% compared to its initial waveform is described.

Figure 8:
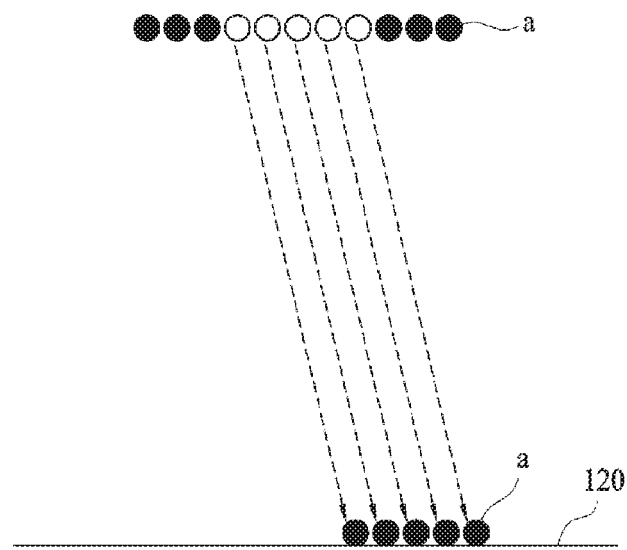
FIG. 8 is a view showing a movement of atoms removed by etching when DC power is applied to the anode.
Figure 9:
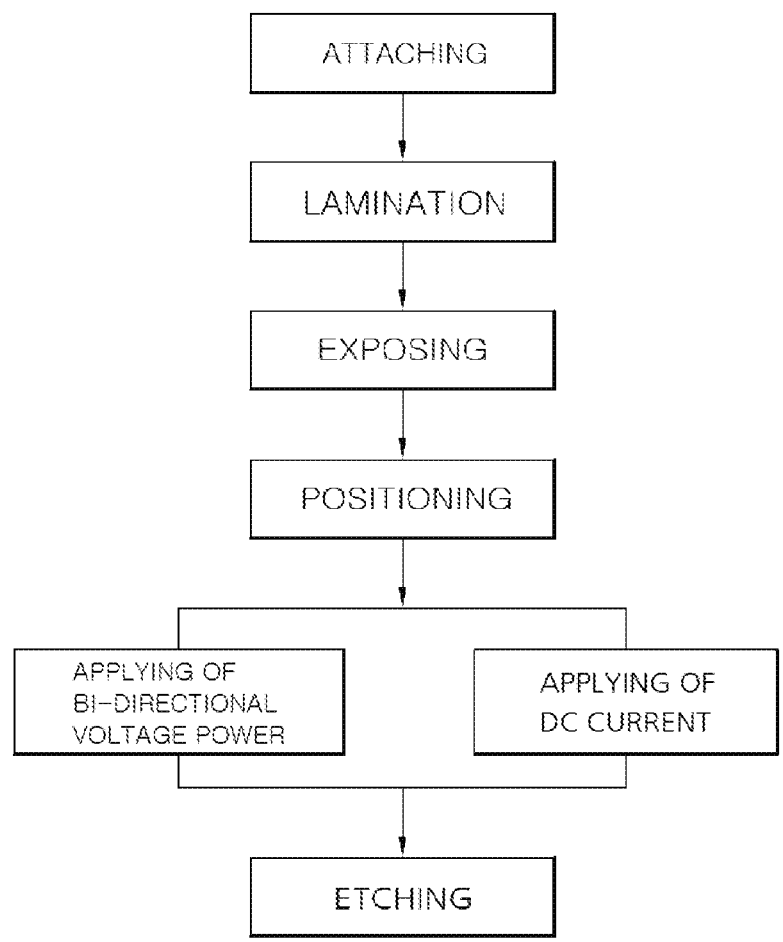
FIG. 9 is a flowchart showing an embodiment of a method for controlling the dry etching device of the present invention.

Accordingly, as shown in FIG. 8, since the time for the atoms a, which are separated away from the etched surface of the work-piece W and fall to the anode part side, to reach the anode part 120 is provided sufficiently re-deposition may be prevented.

Here, DC voltage power applied to the anode part 120 by the DC voltage power applier 160 may be between 1 to 200% of a maximum voltage of the bi-directional voltage power applied to the cathode part 110 by the bi-directional voltage power supplier 130.

Meanwhile, the cathode part 110 may include a first conductor 112, a second conductor 114, and a cathode insulator 116 as shown in FIG. 2.

The first conductor 112 is disposed at an uppermost side, and may be formed of a conductor such as a metal for grounding.

The second conductor 114 is disposed at a lower side of the first conductor 112, to which an AC power in low frequency is applied from the bi-directional voltage power supplier 130, and may be formed of a conductivity metal such as aluminum Al.

In addition, the cathode insulator 116 is disposed between the first conductor 112 and the second conductor 114 and is disposed on an outer periphery of the second conductor 114 so that the cathode insulator 116 may isolate the second conductor 114 from the outside.

The material of the cathode insulator 116 may be any material that may function as an insulator, but a thin insulator 118 provided on a lower side surface contacting the work-piece W may be an oxide such as aluminum oxide (Al2O3) or a nitride insulator such as aluminum nitride (AlN).

Here, the insulator contacted with the work-piece W may be attached to the portion where the bi-directional voltage power is applied, by using the integral coating technique or using the adhesive technique using the bonding material with excellent heat transfer. Accordingly, generated heat may be discharged to a cooling part to facilitate temperature control. In addition, the thin insulator 118 may contribute to increase capacity of the cathode part 110. The thickness of the thin insulator 118 may be equal to or less than 3 mm, and the present invention is not limited to the thickness of the thin insulator 118.

Accordingly, since the insulation is performed so that the current does not flow into the leveling part 180 and the work-piece W being in contact with the cathode part 110, temperature rise of the work-piece W may be prevented.

In addition, the dry etching device of the present invention may further include a temperature controller 170 for controlling temperature of the cathode part 110.

The temperature controller 170 is a component of maintaining temperature of the work-piece W in contact with the cathode part 110 within a process temperature section by controlling the temperature of the cathode part 110.

Here, the process temperature section may mean to a range of constant temperature during processing in which it is possible to obtain good quality work results depending on a material of the work-piece W and a type of work.

That is, by maintaining the temperature that allows smooth processing, the work results of the work-piece W may always be maintained at the best.

The temperature controller 170 may include a cooling channel 172, a coolant circulator 174, and a temperature measurement unit 176.

The cooling channel 172 is provided inside the second conductor 114, and may be shaped into a pipe shape to allow cooling water to flow therein. In the embodiment, the cooling channel 172 is extended from a surface of the first conductor 112 to an inside of the second conductor 114 downward, and may be horizontally extended inside the second conductor 114 to cool the first conductor 112 and the second conductor 114.

In addition, the coolant circulator 174 may be provided to circulate the cooling water in the cooling channel 172.

In addition, the temperature measurement unit 176 may be provided to measure temperature of the second conductor 114.

Therefore, when the temperature is increased by driving the coolant circulator 174 using the control part 190 provided separately so that the temperature measured by the temperature measurement unit 176 does not exceed an upper limit of a preset temperature range, the coolant circulator 174 may be controlled so that circulating amount of the cooling water is increased.

Alternatively, in order that the temperature measured by the temperature measurement unit 176 does not exceed a lower limit of the preset temperature range, the control part 190 may control the coolant circulator 174 to control the circulating amount of the cooling water.

Accordingly, the temperature controller 170 controls the temperature of the cathode part 110, and at the same time, the temperature of the work-piece W contacting the cathode part 110 may be also controlled.

Hereinafter, a method for controlling the dry etching device described above will be described.

Figure 10:
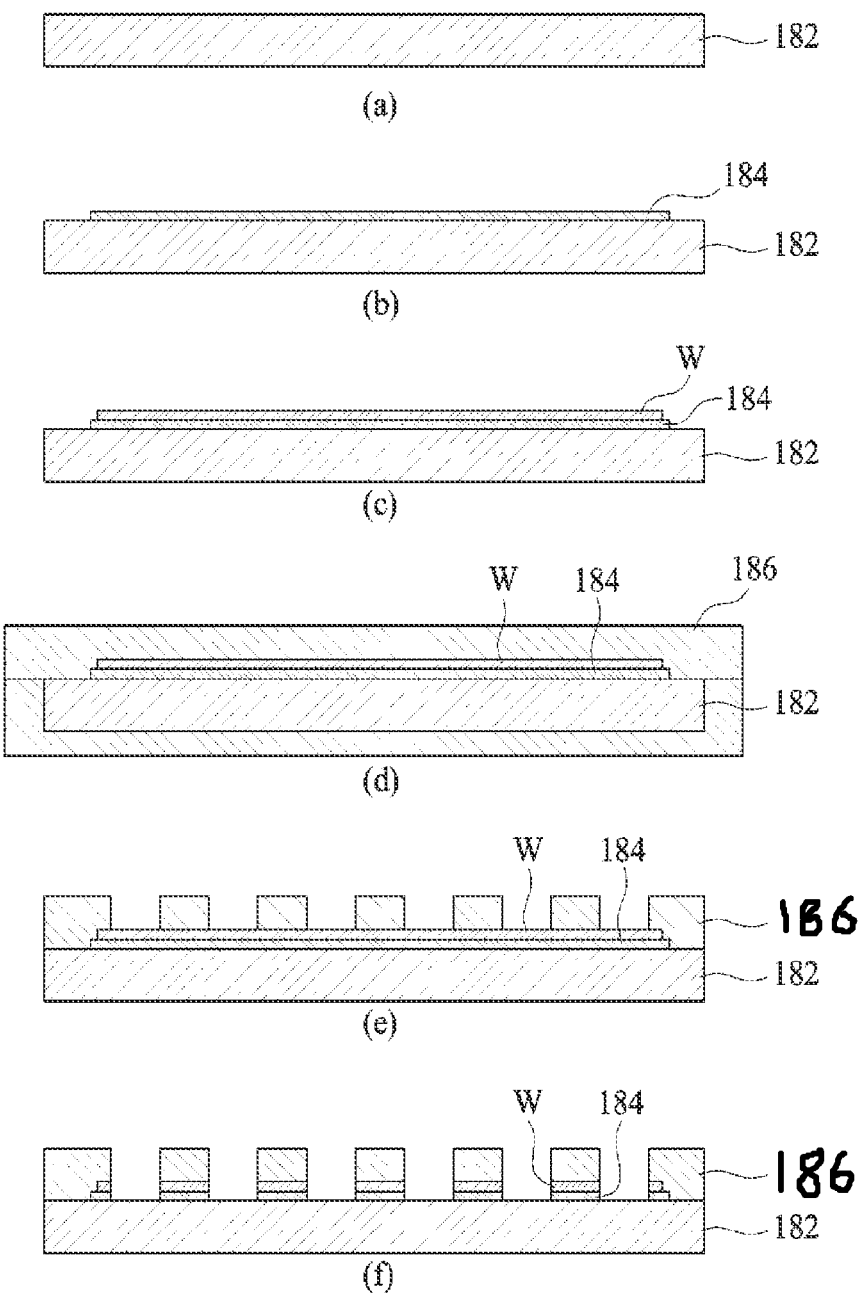
FIG. 10 is a view showing a sequence in which a leveling part is formed and etched according to the present invention.

Before dry etching on the work-piece in earnest, a process for preparing the leveling part may be performed as shown in FIGS. 10a to 10c.

The process of preparing the leveling part 180 may include steps of attaching, laminating, and exposing.

In an attaching step, the work-piece W is attached to the flat plate 182.

Here, as shown in FIG. 10b, the surface of the flat plate 182 where the work-piece W is attached is provided such that the adhesive is spread on the surface or the adhesive layer 184 formed of the double-sided adhesive tape is provided thereon.

In addition, the attachment may also be performed by using static electricity in addition to using the adhesive film or the adhesive.

Here, the work-piece W may mechanically contact after tensile is applied to the surface of the flat plate 182.

As shown in FIG. 10c, the work-piece may be attached to the surface of the flat plate 182 provided with the adhesive layer 184. Here, the work-piece W may be in close contact with the flat plate 182 without creases or spaces.

In a laminating step, as shown in FIG. 10d, the photo-resist film 186 is formed on the outer periphery of the work-piece W attached to the flat plate 182 and on the flat plate 182.

Here, the insert layer 188 having thickness of tens to hundreds of microns may be laminated between the photo-resist film 186 and the work-piece W.

The insert layer 188 may be formed of a material such as a semiconductor material or a nonconductor material.

The insert layer 188 accelerates the ions reaching to the surface of the leveling part 180 so that etching performance may be improved.

The insert layer 188 may be omitted if needed.

The work-piece W attached to the flat plate 182 may be in close contact with the flat plate 182 firmly by the photo-resist film 186.

In an exposing step, as shown FIG. 10e, exposure is performed on the leveling part 180 covered with the photo-resist film 186 to provide the pattern on the photo-resist film 186.

That is, the etching is performed on the portion exposed by the pattern of the photo-resist film 186 of the work-piece W during a subsequent etching process.

Through above processes, the leveling part 180 is prepared, and a positioning step in which the leveling part 180 is positioned in close contact with the cathode part 110 may be performed.

In the positioning step, the leveling part 180 is positioned in close contact with the lower side surface of the cathode part 110. Here, the surface of the work-piece W to be etched may disposed to face the anode part 120 provided on the lower side of the cathode part.

Accordingly, when the lower side surface of the work-piece W is etched, the atoms an etched away from the surface of the work-piece W fall to the anode part side, and thus the re-deposition in which the atoms are redeposited on the surface of the work-piece W may be prevented.

In addition, a step of applying the bi-directional voltage power may be performed. In the applying step, the bi-directional voltage power is applied to the cathode part 110.

Here, the frequency of the bi-directional voltage power applied to the cathode part 110 may be equal to or less than 1 MHz.

By applying the bi-directional voltage power in a relatively low frequency band, charge accumulation time may be increased, which may contribute to the expansion of the sheath region. In addition, it is possible to provide time for the ions to accelerate to the work-piece side so that the plasma ions with higher energy may hit the surface of the work-piece W.

The housing may be in a state of being filled with a gas such as argon (Ar) when the bi-directional voltage power is applied.

In addition, a DC applying step may be performed with the bi-directional voltage power applying step, and in this step, the DC is applied to the anode part 120. Here, the DC in the negative side or the positive side may be applied to the anode part 120. In the embodiment, the example of applying the DC in the negative side is described, but the present invention is not limited thereto.

As the DC is applied to the anode part 120, as shown in FIGS. 5 to 7, the waveform of the bi-directional voltage power provided between the cathode part 110 and the anode part 120 moves toward the positive side as a whole. Thus, the ion hitting time regarding the work-piece W is increased and the electron hitting time regarding the work-piece W may be reduced. As shown in FIG. 8, since the atoms a separated away from the etched surface of the work-piece W and falling to the anode part side may reach the anode part 120 with sufficient time, the re-deposition thereof can be prevented.

Here, the direct current applied to the anode part 120 by the DC voltage power applier 160 may be between 1 to 200% of the maximum voltage of the AC power applied to the cathode part 110 by the bi-directional voltage power supplier 130.

As the bi-directional voltage power applying step and the AC applying step are performed, an etching step in which the surface of the work-piece W is etched S150 may be performed.

When the etching step is performed, as shown in FIG. 10f, the portion exposed by the pattern of the photo-resist film of the leveling part 180 is etched, so that etching of the work-piece W is realized.

Temperature control may be performed during performing the etching step S150. The control part 190, which is separately provided so that the temperature measured by the temperature measurement unit 176 does not exceed the preset temperature range, drives the coolant circulator 174, and may control the coolant circulator 174 so that the circulating amount of the cooling water is increased when the temperature is increased.

Accordingly, the temperature controller 170 may cools the work-piece W contacting the cathode part 110 as well as the cathode part 110. In addition, the temperature controller 170 may also control cooling speed of the work-piece W, and control the temperature of the work-piece W so that it does not exceed the low limit of the preset temperature range.

Although the exemplary embodiments of the present invention have been described for illustrative purposes, those skilled in the art will appreciate that various modifications, additions and substitutions are possible, without departing from the scope and spirit of the invention as disclosed in the accompanying claims.

The invention claimed is:

1. A dry etching device, comprising:
an anode;
a cathode disposed at an upper side of the anode and facing the anode, receiving bi-directional voltage power of which polarity of a voltage alternates between a positive voltage and a negative voltage depending on time, and disposed to be spaced from the anode;
a leveler disposed in close contact with a surface of the cathode facing the anode, and positioning a work-piece in a flat state; a holder configured to hold the work-piece and the leveler on the surface of the cathode facing the anode;
a bi-directional voltage power supplier configured to apply the bi-directional voltage power to the cathode;
a controller connected to the bi-directional voltage power supplier and comprising a computer configured to calculate and to control a waveform of the bi-directional voltage power; and
a direct current (DC) voltage power applier configured to apply DC voltage power to the anode causing the waveform of the bi-directional voltage power provided between the cathode and the anode to move toward a positive side as a whole, such that ion hitting time applied to the work-piece is reduced and electron hitting time applied thereto is increased,
wherein the bi-directional voltage power comprises a boost section in which the waveform of the voltage disperses negatively or positively, a decreasing section in which the waveform of the voltage converges to o, and a maintain section in which the voltage is constantly retained between the boost section and the decreasing section, and the slopes of the boost section and the decreasing section exhibit a bipolar waveform in which the slopes are constantly maintained,
wherein the slopes and lengths of the boost section, the decreasing section and the maintain section are controlled by the controller and a sufficient time is secured until atoms separated from the work-piece through etching and falling due to gravity toward the anode reach the anode to prevent redeposition,
wherein as the DC voltage power is applied to the anode, the waveform of the bi-directional voltage power supplier formed between the cathode and the anode is caused to shift by 20% from an original waveform in a positive direction as a whole thereby decreasing an ion hitting time required for the work-piece while increasing an electron hitting time required for the work-piece, and
wherein the cathode includes a first conductor, a second conductor and a cathode insulator, where the cathode insulator is disposed between the first conductor and the second conductor.

2. The dry etching device of claim 1, wherein the leveler is in close contact with the surface of the cathode facing the anode, and includes:
a flat plate configured such that the work-piece is closely attached to a rear surface thereof in the flat state.

3. The dry etching device of claim 2, wherein the leveler includes:

a photo-resist film provided around a surface of the work-piece and on the flat plate to which the work-piece is attached.

4. The dry etching device of claim 2, wherein the leveler is provided with an adhesive layer at a position between the flat plate and the work-piece for attaching the work-piece to the flat plate.

5. The dry etching device of claim 4, wherein the adhesive layer is a double-sided adhesive material configured and disposed to bond the flat plate to the work-piece.

6. The dry etching device of claim 2, wherein the work-piece is attached to the flat plate by using static electricity.

7. The dry etching device of claim 3, further comprising:
an insert layer laminated between the work-piece and the photo-resist film and made of a material such as a semiconductor or a nonconductor.

8. The dry etching device of claim 3, wherein the holder supports elastically the leveler so that the flat plate is disposed in close contact with the surface of the cathode facing the anode.

9. The dry etching device of claim 1, the power applied through the DC voltage power applier is a positive voltage or a negative voltage.

* * * * *